(12) United States Patent
Langhammer et al.

(10) Patent No.: US 9,934,841 B1
(45) Date of Patent: Apr. 3, 2018

(54) SYSTEMS AND METHODS FOR REFRESHING DATA IN MEMORY CIRCUITS

(71) Applicant: Altera Corporation, San Jose, CA (US)

(72) Inventors: Martin Langhammer, Salisbury (GB); Sami Mumtaz, Bois d'Arcy (FR)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/299,653

(22) Filed: Oct. 21, 2016

(51) Int. Cl.
*G11C 7/00* (2006.01)
*G11C 11/406* (2006.01)
*G06F 11/10* (2006.01)

(52) U.S. Cl.
CPC ........ *G11C 11/406* (2013.01); *G06F 11/1048* (2013.01)

(58) Field of Classification Search
CPC ........................... G11C 11/406; G06F 11/1048
See application file for complete search history.

(56) References Cited

U.S. PATENT DOCUMENTS

| | | | |
|---|---|---|---|
| 4,380,812 A | 4/1983 | Ziegler et al. | |
| 4,710,934 A | 12/1987 | Traynor | |
| 6,791,877 B2 | 9/2004 | Miura et al. | |
| 7,613,880 B2 | 11/2009 | Miura et al. | |
| 2001/0052103 A1* | 12/2001 | Hirofuji | H03M 13/1515 714/781 |
| 2006/0282755 A1 | 12/2006 | Oh | |
| 2012/0272017 A1* | 10/2012 | Lee | G06F 11/1048 711/154 |
| 2015/0235716 A1* | 8/2015 | O'Connell | G11C 29/4401 714/723 |

* cited by examiner

*Primary Examiner* — Mohammed A Bashar

(57) ABSTRACT

A memory refreshing circuit implemented on an integrated circuit comprising a memory circuit that stores original data and an algorithmic data generation circuit that generates write addresses and correct data such that the correct data is stored in the memory circuit at locations that are indicated by the write addresses to correct errors in the original data by overwriting the original data with the correct data during a random access mode of operation of the memory circuit.

19 Claims, 5 Drawing Sheets

SYSTEMS AND METHODS FOR REFRESHING DATA IN MEMORY CIRCUITS

FIELD OF THE DISCLOSURE

The present disclosure relates to electronic circuits, and more particularly, to systems and methods for refreshing data in memory circuits.

BACKGROUND

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

In certain applications, memory circuitry may need to be refreshed periodically with the same values. One example application where this may occur is for Reed-Solomon forward error correction (FEC) operating in a 100 GB/s or 400 GB/s Ethernet link (referred to as 100GE and 400GE respectively).

In an example implementation, Reed-Solomon ECC circuitry may require calculation of inverse values of a finite field for different algorithms such as the Forney algorithm or the Berlekamp-Massey algorithm. An implementation of Reed-Solomon ECC circuitry on programmable circuitry, such as a field programmable gate array (FPGA), may include using many parallel memory blocks configured as read-only memories (ROMs) to perform lookups for the appropriate inverse values that are calculated and stored in the parallel memory blocks. Some implementations of the Reed-Solomon ECC block would include 33 and 128 parallel memories for 100GE and 400GE, respectively.

Large Reed-Solomon ECC circuitry would require large parallel memories. However, the problem with larger memories used as ROMs is that error conditions such as single event upsets (SEUs) are left uncorrected because error correction would require a large amount of circuitry. In fact, for large Reed-Solomon circuitry with large parallel memories, the error correction circuitry may cost as much as the rest of the Reed-Solomon circuitry.

SUMMARY

Embodiments described herein include a method of dividing a set of components of an integrated circuit. It should be appreciated that the embodiments can be implemented in numerous ways, such as a process, an apparatus, a system, a device, or a method. Several embodiments are described below.

In one embodiment, memory refreshing circuitry is disclosed. The memory refreshing circuitry may include a memory circuit that may store original data. The circuitry may further include an algorithmic data generation circuit that generates write addresses and corrected data. The corrected data may be stored in the memory circuit at locations that are indicated by the write addresses to correct errors in the original data by overwriting the original data with the correct data during a random access mode of operation of the memory circuit. In an embodiment, one value of the corrected data is read from the memory circuit at a location indicated by a read address during a read only memory mode of operation of the memory circuit.

In an embodiment, the algorithmic data generation circuit may further include a first register that stores a first finite field value. The algorithmic data generation circuit may also include a first Galois Field (GF) multiplier coupled to the first register, wherein the first GF multiplier multiplies a first value with the first finite field value to generate a first output. The algorithmic data generation circuit may further include a second register that stores a second finite field value, wherein the second finite field value is a mathematical inverse of the first finite field value. The algorithmic data generation circuit may also include a second GF multiplier coupled to the second register, wherein the second GF multiplier multiplies a second value with the second finite field value to generate a second output.

In an embodiment, the first value may be a primitive root of the first finite field value. In an embodiment, the second value is a mathematical inverse of the primitive root of the first finite field value.

In an embodiment, the first output is a write address and the second output is a value of corrected data to be stored at the write address. In another embodiment, the second output is a write address and the first output is a value of corrected data to be stored at the write address.

In an embodiment, the first and second GF multipliers include at least one bitwise AND gate. In another embodiment, the algorithmic data generation circuit may include an address circuit, wherein the address circuit is a counter circuit that cycles through a set of addresses that define a memory space of the memory circuit. The algorithmic data generation circuit may further include a data circuit, wherein the data circuit is a look-up table that stores the corrected data for each address in the memory space of the memory circuit.

In another embodiment, a method of refreshing memory circuitry that stores original data is disclosed. The method may include an operation to generate write addresses and correct data using an algorithmic data generation circuit. The correct data is stored in the memory circuit at locations that are indicated by the write addresses to correct errors in the original data by overwriting the original data with the correct data during a random access mode of operation of the memory circuit. The method may also include an operation to read one value of the correct data from the memory circuit at a location indicated by a read address during a read only memory mode of operation of the memory circuit.

In an embodiment, generating write addresses may further include an operation to receive a clock signal at a first register that generates and stores a first finite field value based on the clock signal. The method to generate write addresses may also include an operation to multiply the first field value with a first value using a first GF multiplier.

In an embodiment, generating write addresses may further include an operation to receive a clock signal at a first register that generates and stores a first finite field value based on the clock signal. Generating write addresses may also include an operation to multiply the first field value with a first value using a first GF multiplier.

Further features of the invention, its nature, and various advantages will be more apparent from the accompanying drawings and the following detailed description of the preferred embodiments.

DETAILED DESCRIPTION

Embodiments of the present invention relate to integrated circuits with logic circuitry. The integrated circuits may be any suitable type of integrated circuit, such as microprocessors, application-specific integrated circuits, digital signal processors, memory circuits, or other integrated circuits. If desired, the integrated circuits may be programmable integrated circuits that contain programmable logic circuitry. The present invention will generally be described in the context of integrated circuits such as programmable logic device (PLD) integrated circuits as an example. In the following description, the terms 'circuitry' and 'circuit' are used interchangeably.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Several features are described hereafter that can each be used independently of one another or with any combination of other features. However, any individual feature may not address any of the problems discussed above or might only address one of the problems discussed above. Some of the problems discussed above might not be fully addressed by any of the features described herein.

Figure 1:
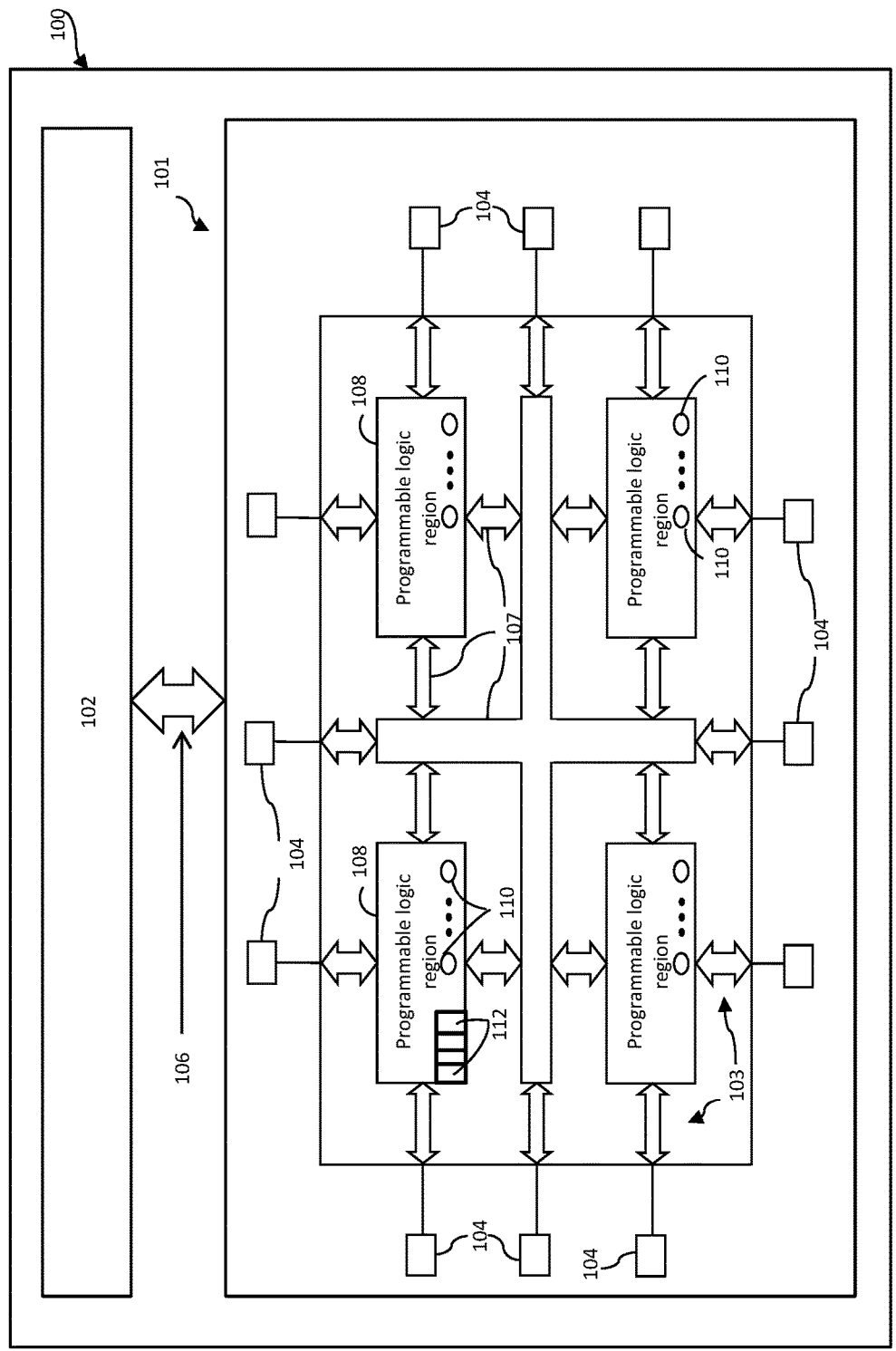
FIG. 1 illustrates exemplary integrated circuit in accordance with an embodiment of the present invention.

FIG. 1 illustrates an example integrated circuit 100 in accordance with an embodiment of the present invention. In FIG. 1, integrated circuit 100 may include processing circuitry 102 communicatively coupled to a programmable logic device (PLD) circuit 101 via interconnection circuitry 106. Processing circuitry 102 may be a central processing unit (CPU), a microprocessor, a floating-point coprocessor, a graphics coprocessor, a hardware controller, a network controller, a Reduced Instruction Set Computing (RISC) based processor such as an Acorn RISC Machine (ARM) processor, or other processing unit.

a) PLD 101 may include input-output circuitry 103 for driving signals off of PLD 101 and for receiving signals from other devices via input-output pads 104. Interconnect circuitry 106 may include interconnection resources such as global and local vertical and horizontal conductive lines and buses that may be used to route signals on PLD 101. The interconnect circuitry 106 includes conductive lines and programmable connections between respective conductive lines and is therefore sometimes referred to as programmable interconnects.

b) The interconnect circuitry 106 may form a network-on-chip (NOC). A NOC may be a system of interconnect resources such as multiplexers and de-multiplexers that applies general networking technologies to connect the processing circuitry 102 with PLD 101 and to route signals on PLD 101. The NOC may perform network communication functions. For example, the NOC may perform routing functions, gateway functions, protocol or address translation, and security functions.

PLD 101 may include programmable logic region 108 that can be configured to perform a custom logic function. Programmable logic region 108 may include combinational and sequential logic circuitry. The interconnect circuitry 106 may be considered to be a type of programmable logic 108.

PLD 101 may also contain programmable memory elements 110. Programmable memory elements 110 can be loaded with configuration data (also called programming data) using pads 104 and input-output circuitry 103. Once loaded, the programmable memory elements 110 may each provide a corresponding static control signal that controls the operation of an associated logic component in programmable logic 108. In a typical scenario, the outputs of the loaded programmable memory elements 110 are applied to the gates of field-effect transistors in programmable logic 108 to turn certain transistors on or off and thereby configure the logic in programmable logic region 108 and routing paths. Programmable logic circuit elements that may be controlled in this way include pass transistors, parts of multiplexers (e.g., multiplexers used for forming routing paths in interconnect circuitry 106), look-up tables, logic arrays, various logic gates, etc.

Programmable memory elements 110 may be implemented using any suitable volatile and/or non-volatile memory structures such as random-access-memory (RAM) cells, fuses, antifuses, programmable read-only-memory memory cells, mask-programmed and laser-programmed structures, resistive memory structures, combinations of these structures, etc. Because programmable memory elements 110 are loaded with configuration data during programming, programmable memory elements 110 are sometimes referred to as configuration memory, configuration RAM (CRAM), or programmable memory elements.

The circuitry of PLD 101 may be organized using any suitable architecture. As an example, the logic of PLD 101 may be organized in a series of rows and columns of larger programmable logic regions 108 each of which contains multiple smaller logic blocks 112. The smaller logic blocks 112 may be, for example, regions of logic that are sometimes referred to as logic elements (LEs), each containing a look-up table (LUT), one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other blocks of shared combinational logic (as an example). The larger regions may be, for example, logic array blocks (LABs) containing multiple logic elements or multiple ALMs. In the example of FIG. 1, illustrative smaller logic blocks 112 (which may be, for example, LEs or ALMs) are shown in one of the larger regions of programmable logic 108 in FIG. 1 (which may be, for example, a logic array block). In a typical PLD 101, there may be hundreds or thousands of smaller logic blocks 112. The smaller logic blocks 112 that are shown in FIG. 1 are merely illustrative.

During device programming, configuration data that configures the smaller logic blocks 112 and programmable logic regions 108, so that their logic resources perform desired logic functions on their inputs and produce desired output signals, is loaded into PLD 101. For example, CRAM cells are loaded with appropriate configuration data bits to configure adders and other circuits on PLD 101 to implement desired custom logic designs.

The resources of PLD 101, such as programmable logic 108, may be interconnected by on-chip programmable interconnects 107. On-chip programmable interconnects 107 generally include vertical and horizontal conductors. These conductors may include global conductive lines that span substantially all of device 101, fractional lines such as half-lines or quarter lines that span part of PLD 101, staggered lines of a particular length (e.g., sufficient to interconnect several logic array blocks or other such logic areas), smaller local lines, or any other suitable interconnection resource arrangement. If desired, the logic of PLD 101 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, PLD 101 generally also includes some programmable logic associated with the programmable interconnects, memory, and input-output circuitry on PLD 101. For example, input-output circuitry 103 may contain programmable input and output buffers. On-chip programmable interconnects 107 may be programmed to route signals to a desired destination.

Regions in a programmable logic device may be dedicated to digital signal processing circuitry. Circuitry for providing digital signal processing operations may be concentrated in a region in a programmable logic device (e.g., concentrated only in that region). A plurality of such regions may be arranged in a programmable logic device. Digital signal processing circuitry may be provided to perform multistage digital signal processing operations. The organization of the digital signal processing circuitry may make that circuitry open for use in many commonly used digital signal processing operations. A desired digital signal processing operation of interest may be selected from a particular set of digital signal processing operations that the digital signal processing region is configured to perform. A programmable logic device with digital signal processing regions may have other resources (e.g., programmable logic regions, memory, etc.) that are integrated with the digital signal processing regions for high speed, low latency, or quick implementation of applications that are currently in high demand. Examples of such applications include video image processing, digital communications signal processing, or other applications that involve a combination of logic operations and digital signal processing operations for suitable operation.

Error correction is an important feature of modern communication schemes. For example, in an ideal communication scheme, the information received is identical to the source transmission. However, in a typical real communication scheme, the information passes through a noisy communication channel to the receiver. The information received at the destination is likely to contain errors due to the channel noise. The acceptable level of transmitted signal corruption (error level) depends on the application. Voice communication, for example, is relatively error tolerant. However, the prospect of occasionally losing a digit in communications of financial data highlights the need for error-control mechanisms. The two main types of error-control codes used in communications systems are as follows:

a) Convolutional codes: Each bit depends on the current bit as well as on a number of previous bits. In this sense, the convolutional code has a memory. The most common scheme for decoding convolutional codes is the Viterbi algorithm.

b) Block codes: A bitstream is divided into message blocks of fixed length called frames. The valid codeword block is formed from the message bitstream by adding a proper redundant part. Each code word is independent of the previous one, so the code is memory-less.

The Reed-Solomon codes are block codes. Unlike convolutional codes, Reed-Solomon codes operate on multi-bit symbols rather than on individual bits. This code is an error detection and correction scheme based on the use of Galois field arithmetic and is well understood by persons having ordinary skill in the art.

A Number Field has the Following Properties:
a) Both an addition and a multiplication operation that satisfy the commutative, associative, and distributive laws
b) Closure, so that adding or multiplying elements always yields field elements as results
c) Both zero and unity elements such that the zero element leaves an element unchanged under addition and the unity element leaves an element unchanged under multiplication
d) An additive/multiplicative inverse for each field element with the sole exception that is the zero element, which has no multiplicative inverse. An example of a number field is the set of real numbers together with the addition and multiplication operations. Galois fields differ from real number fields in that they have only a finite number of elements. Otherwise, they share all the properties common to number fields.

The simplest Galois field is GF (2). Its elements are the set {0,1} under modulo-2 algebra. Addition and subtraction in this algebra are both equivalent to the logical XOR operation. The addition and multiplication tables of GF (2) are shown below:

| a) Addition | | |
|---|---|---|
| + | 0 | 1 |
| 0 | 0 | 1 |
| 1 | 1 | 0 |

| b) Multiplication | | |
|---|---|---|
| * | 0 | 1 |
| 0 | 0 | 0 |
| 1 | 0 | 1 |

There is a one-to-one correspondence between any binary number and a polynomial in that every binary number can be represented as a polynomial over GF (2), and vice versa. A polynomial of degree D over GF (2) has the following general form:

$$f(x) = f_0 + f_1 x + f_2 x^2 + f_3 x^3 \ldots + f_D x^D \quad (1)$$

where the coefficients $f_0, \ldots, f_D$ are taken from GF(2). A binary number of (N+1) bits can be represented as an abstract polynomial of degree N by taking the coefficients equal to the bits and the exponents of x equal to the bit locations. For example, the binary number 100011101 is equivalent to the following polynomial:

$$100011101 \longleftrightarrow 1 + x^2 + x^3 + x^4 + x^8 \quad (2)$$

The bit at the zero position (the coefficient of $x^0$) is equal to 1, the bit at the first position (the coefficient of x) is equal to 0, the bit at the second position (the coefficient of $x^2$) is equal to 1, and so on. Operations on polynomials, such as addition, subtraction, multiplication, and division, are performed in an analogous way to the real number field. The sole difference is that the operations on the coefficients are performed under modulo-2 algebra. For example, the multiplication of two polynomials is as follows:

$$(1+x^2+x^3+x^4) \cdot (x^3+x^5) = x^3+x^5+x^5+x^6+x^7+x^7+x^8+x^9 = x^3 + x^6+x^8+x^9 \quad (3)$$

This result differs from the result obtained over the real number field (the middle expression) due to the XOR operation (the + operation). The terms that appear an even number of times cancel out, so the coefficients of $x^5$ and $x^7$ are not present in the end result.

A polynomial p(x) over GF (2) is defined as irreducible if it cannot be factored into non-zero polynomials over GF (2) of smaller degrees. It is further defined as primitive if $n=(x^n+1)$ divided by p(x) and the smallest positive integer n equals $2^{m-1}$, where m is the polynomial degree. An element of GF ($2^m$) is defined as the root of a primitive polynomial p(x) of degree m. An element a is defined as primitive if $$\alpha^{i \bmod (2^m-1)} \quad (4)$$

where i ∈N, can produce $2^{m-1}$ field elements (excluding the zero element). In general, extended Galois fields of class GF($2^m$) possess $2^m$ elements, where m is the symbol size, that is, the size of an element, in bits. For example, in ADSL systems, the Galois field is GF (256). For other applications like 100 GE, the Galois field is GF (1024). GF (256) is generated by the following primitive polynomial:

$$1+x^2+x^3+x^4+x^8 \quad (5)$$

This is a degree-eight irreducible polynomial. The field elements are degree-seven polynomials. Due to the one-to-one mapping that exists between polynomials over GF (2) and binary numbers, the field elements are representable as binary numbers of eight bits each, that is, as bytes. In GF ($2^m$) fields, all elements besides the zero element can be represented in two alternative ways:

a) In binary form, as an ordinary binary number.
b) In exponential form, as $\alpha^p$. It follows from these definitions that the exponent p is an integer ranging from 0 to ($2^{m-2}$). Conventionally, the primitive element is chosen as 0x02, in binary representation.

As for GF (2), addition over GF ($2^m$) is the bitwise XOR of two elements. Galois multiplication is performed in two steps: multiplying the two operands represented as polynomials and taking the remainder of the division by the primitive polynomial, all over GF (2). Alternatively, multiplication can be performed by adding the exponents of the two operands. The exponent of the product is the sum of exponents, modulo 2m−1. Polynomials over the Galois field are used in the Reed-Solomon algorithm. The mapping between bitstreams and polynomials for GF ($2^m$) is analogous to that of GF (2). A polynomial of degree D over GF ($2^m$) has the most general form:

$$f(x)=f_0+f_1x+f_2x^2+f_3x^3 \ldots +f_Dx^D \quad (6)$$

where the coefficients $f_0$-$f_D$ are elements of GF($2^m$). A bitstream of (N+1)m bits is mapped into an abstract polynomial of degree N by setting the coefficients equal to the symbol values and the exponents of x equal to the bit locations. The Galois field is GF (256), so the bitstream is divided into symbols of eight consecutive bits each. The first symbol in the bitstream is 00000001. In exponential representation, 00000001 becomes $\alpha^0$. Thus, $\alpha^0$ becomes the coefficient of $x^0$. The second symbol is 11001100, so the coefficient of x is $\alpha^{127}$ and so on. The elements are conventionally arranged in a log table so that the index equals the exponent, and the entry equals the element in its binary form. Although multiplication is a complicated operation when performed bitwise, it is very simple if the exponential representation is used. The converse is true for addition. Therefore, two types of look-up tables are useful: a log table and an anti-log table that translates from binary to exponential representation.

Reed-Solomon codes are encoded and decoded within the general framework of algebraic coding theory. The main principle of algebraic coding theory is to map bitstreams into abstract polynomials on which a series of mathematical operations is performed. Reed-Solomon coding is, in essence, manipulations on polynomials over GF ($2^m$). A block consists of information symbols and added redundant symbols. The total number of symbols is the fixed number 2m−1. The two important code parameters are the symbol size m and the upper bound, T, on correctable symbols within a block. T also determines the code rate, because the number of information symbols within a block is the total number of symbols, minus 2T. Denoting the number of errors with an unknown location as $n_{errors}$ and the number of errors with known locations as $n_{erasures}$, the Reed-Solomon algorithm guarantees to correct a block, provided that the following is true: $2n_{errors}+n_{erasures} \leq 2T$, where T is configurable.

In the encoding process for creating Reed-Solomon codes, when the encoder receives an information sequence, it creates encoded blocks consisting of m symbols each. The encoder divides the information sequence into message blocks of K=N−2T symbols. Each message block is equivalent to a message polynomial of degree K−1, denoted as m(x). In systematic encoding, the encoded block is formed by simply appending redundant symbols to the end of the K-symbols long-message block. The redundant symbols are also called parity-check symbols. The redundant symbols are obtained from the redundant polynomial p(x), which is the remainder obtained by dividing x2Tm(x) by the generator polynomial g(x):

$$p(x)=(x^{2T}m(x)) \bmod g(x) \quad (7)$$

where g(x) is the generator polynomial. The code-word polynomial c(x) is defined as follows:

$$c(x)=x^{2T}m(x)p(x) \quad (8)$$

Since in GF($2^m$) algebra, plus (+), and minus (−) are the same, the code word actually equals the polynomial $x^{2T}m(x)$ minus its remainder under division by g(x). It follows that c(x) is a multiple of g(x). Since there is a total of $2^{mK}$ different possible messages, there are $2^{mK}$ different valid code words at the encoder output. This set of $2^{mK}$ code words of length N is called an (N,K) block code.

For decoding Reed-Solomon codes, when a received block is input to the decoder for processing, the decoder first verifies whether this block appears in the dictionary of valid code words. If it does not, errors must have occurred during transmission. This part of the decoder processing is called error detection. The parameters necessary to reconstruct the original encoded block are available to the decoder. If errors are detected, the decoder attempts a reconstruction. This is called error correction. Conventionally, decoding is performed by the Petersen-Gorenstein-Zierler (PGZ) algorithm, which consists of four parts: (1) Syndromes calculation, (2) Derivation of the error-location polynomial, (3) Roots search, and (4) Derivation of error values. The error-location polynomial in this implementation is found using the Berlekamp-Massey algorithm, and the error values are obtained by the Forney algorithm. The four decoding parts are briefly outlined as below.

Syndromes calculation: From the received block, the received polynomial is reconstructed, denoted as c(x). The received polynomial is the superposition of the correct code word c(x) and an error polynomial e(x):

$$r(x)=c(x)+e(x) \qquad (9)$$

The error polynomial is given in its most general form by:

$$e(x)=e_{i_0}x^{i_0}+e_{i_1}x^{i_1}+e_{i_2}x^{i_2}+\ldots+e_{i_{(v-1)}}x^{i_{(v-1)}} \qquad (10)$$

where $i_0$, $i_1$ and so on denote the error location indices, and v the actual number of errors that have occurred. The 2T syndromes are obtained by evaluating the received polynomial r(x) at the 2T field points:

$$\alpha,\alpha^2,\alpha^3,\alpha^4\ldots,\alpha^{2T} \qquad (11)$$

Since c(x) is a multiple of g(x), it has the following general form:

$$c(x)=q(x)g(x) \qquad (12)$$

where q(x) is a message-dependent polynomial. It follows from the definition of g(x) that the following field points:

$$\alpha,\alpha^2,\alpha^3,\alpha^4\ldots,\alpha^{2T} \qquad (13)$$

are roots of g(x). Hence, c(x) vanishes at the 2T points and the syndromes:

$$S_1,S_2,S_3,\ldots S_{2T} \qquad (14)$$

contain only of the part consisting of the error polynomial e(x):

$$S_1=e(\alpha),S_2=e(\alpha^2),S_3=e(\alpha^3),\ldots S_{2T}=e(\alpha^{2T}) \qquad (15)$$

If all 2T syndromes vanish, e(x) is either identically zero, indicating that no errors have occurred during the transmission, or an undetectable error pattern has occurred. If one or more syndromes are non-zero, errors have been detected. The next steps of the decoder are to retrieve the error locations and the error values from the syndromes. Denoting the actual number of errors as v, $x^{i_k}$ as $X_k$ and the error values as $e^{i_k}Y_k$, the 2T syndromes $S_1$–$S_{2T}$ can then be expressed as follows:

$$S_1=Y_1X_1+Y_2X_2+Y_3X_3+\ldots Y_vX_v$$

$$S_2=Y_1(X_1)^2+Y_2(X_2)^2+Y_3(X_3)^2+\ldots Y_v(X_v)^2$$

$$S_3=Y_1(X_1)^3+Y_2(X_2)^3+Y_3(X_3)^3+\ldots Y_v(X_v)^3$$

$$\ldots$$

$$S_{2T}=Y_1(X_1)^{2T}+Y_2(X_2)^{2T}+Y_3(X_3)^{2T}+\ldots Y_v(X_v)^{2T} \qquad (16)$$

Thus, there are 2T equations to solve that are linear in the error values $Y_k$ and non-linear in the error locations $X_k$.

Derivation of the error-location polynomial: The output of the Berlekamp-Massey algorithm is the error-location polynomial $\lambda(x)$, defined as:

$$\lambda(x)=(1+xX_1)(1+xX_2)(1+xX_3)\ldots(1+xX_v)\equiv 1+\lambda_1 x+ \lambda_2 x^2+\lambda_3 x^3+\ldots \lambda_v x^v \qquad (17)$$

$\lambda(x)$ has at most v different roots. The inverses of the roots have the form, $\alpha^{i_k}$ where $i_k$ is the error location index. It can be proven that the so-called Newton identity holds for the coefficients of $\lambda(x)$ and the syndromes:

$$S_{j+v}+\lambda_1 S_{j+v-1}+\lambda_2 S_{j+v-2}+\ldots \lambda_v S_v=0 \qquad (18)$$

The Berlekamp-Massey algorithm is an iterative way to find a minimum-degree polynomial that satisfies the Newton identities for any j. If the degree of $\lambda(x)$ obtained by the Berlekamp-Massey algorithm exceeds T, this indicates that more than T errors have occurred and the block is therefore not correctable. In this case, the decoder detects the occurrence of errors in the block, but no further attempt at correction is made, and the decoding procedure stops at this point for this block.

Roots search: The roots of the error-location polynomial are obtained by an exhaustive search, that is, by evaluating $\lambda(x)$ at all Galois field elements, checking for possible zero results. This is done using the Chien search algorithm. The exponents of the inverses of the roots are equal to the error-location indices. If the number of roots is less than the degree of $\lambda(x)$, more than T errors have occurred. In this case, errors are detected, but they are not corrected, and decoding stops at this point for this block.

Derivation of error values: The error values are obtained from the Forney algorithm in this implementation. Once the error locations $X_k$ are found, the error values $Y_k$ are found from the v first syndromes equation by solving the following:

$$\begin{bmatrix} X_1 & X_2 & X_3 & \ldots & X_v \\ \ldots & \ldots & \ldots & \ldots & \ldots \\ X_1^v & X_2^v & X_3^v & \ldots & X_1^v \end{bmatrix} \begin{bmatrix} Y_1 \\ \ldots \\ Y_v \end{bmatrix} = - \begin{bmatrix} S_1 \\ \ldots \\ S_v \end{bmatrix} \qquad (19)$$

The Forney algorithm is an efficient way to invert the matrix and solve for the errors values $Y_1$–$Y_k$.

Thus, using the Forney algorithm requires division over the GF( ). A GF( ) division is typically implemented by first inverting a number over the finite field, which may be implemented using a look up table. A ROM or synthesized look up table may be used, but a programmable logic device 101 contains many RAM blocks 110, which can be used for this purpose. As stated previously, the RAM memories cannot reliably maintain correct information over long periods of time (such as years). This is a commonly understood characteristic of modern semiconductor circuits, where programmable cells, such as RAMS, may be affected by radiation, etc. By applying the disclosed memory refresh methods, RAM reliability may be maintained over long periods.

Figure 2:
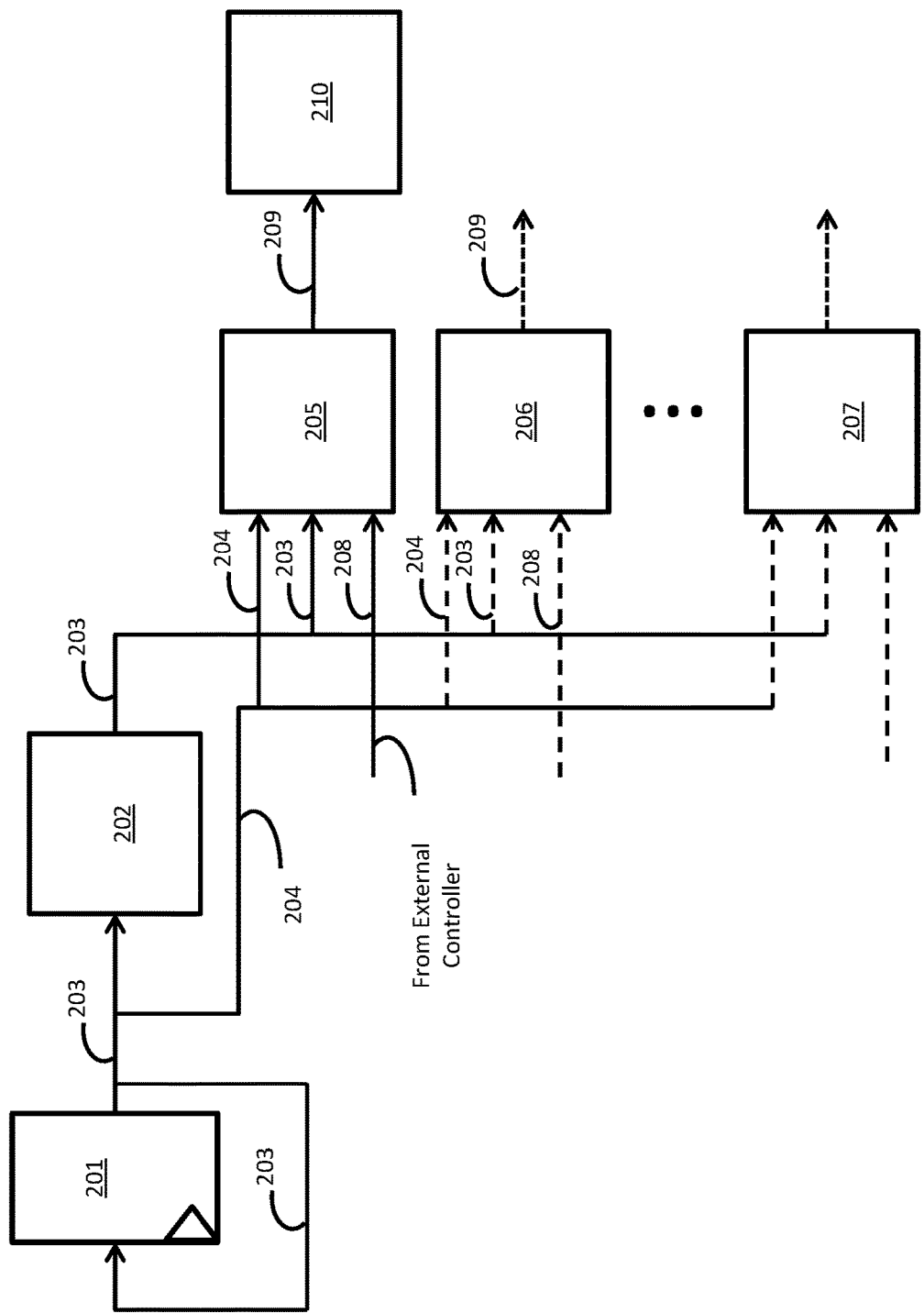
FIG. 2 illustrates exemplary memory refresh circuitry in accordance with an embodiment of the present invention.

FIG. 2 illustrates exemplary memory refresh circuitry in accordance with an embodiment of the current invention. For the purposes of illustrating clear examples, FIG. 2 will be discussed in reference to integrated circuit 100 of FIG. 1.

In an embodiment, the memory refresh circuitry of FIG. 2 may include address circuit 201. Address circuit 201 may generate addresses that span the address space of memory circuits 205, 206, and 207. In an embodiment, address circuit 201 is implemented as a counter that, after being initialized with an address, counts through the set of addresses that span the address space of memory circuits 205, 206, 207. In an embodiment, memory circuits 205, 206, and 207 are memory blocks in an array of parallel memory blocks.

In an embodiment, memory circuits 205, 206, and 207 are similar to programmable memory elements 110 implemented on PLD 101 described in the above sections. Address circuit 201 may count in any order. For example, address circuit 201 may count through the address space of memory circuit 205, followed by memory circuit 206, and so on. Similarly, address circuit 201 may count through the address space of memory circuit 207, followed by memory circuit 205 and so on. In an embodiment, address circuit 201 counts through addresses in a randomized order. In an embodiment, address circuit 201 operates at an operating frequency that is lower than the operating frequency of the host integrated circuit. For example, if the memory refresh circuitry is implemented in a 100GE application on PLD 101, then the system clock frequency may be 322 MHz for PLD 101. However, the memory refresh circuit may operate at a KHz rate (i.e. refresh the memory locations of memory circuits 205, 206, and 207) and still be effective at the KHz update rate.

In an embodiment, address circuit 201 broadcasts address 204 to memory circuits 205, 206, and 207 and data circuit 202. As discussed previously, address 204 is one of the addresses from a set of addresses that span the address space of memory circuits 205, 206, and 207. In an embodiment, address 204 may be generated in response to external input. In an embodiment, address 204 may be generated in a randomized manner by specialized circuitry in address generating circuit 201.

In an embodiment, data circuit 202 generates corrected data 203 based on the address received from address circuit 201. Data circuit 202 then broadcasts corrected data 203 to memory circuits 205, 206, and 207. In an embodiment, corrected data 203 generated by data circuit 202 is the corrected data as determined by a Reed-Solomon ECC circuitry to replace the possible erroneous data at address 204. In an embodiment, corrected data 203 generated by data circuit 202 includes Galois field values to be stored at a memory location specified by address 204. In an embodiment, the Galois filed values are for use in executing Berlekamp-Massey algorithm and Forney algorithm in Reed-Solomon ECC.

Signal 208 may be used by an external controller to read data in at least one of memory circuits 205, 206, and 207 at a location indicated by address 204 at full speed. This data may be output at output data line 209. Output data line 209 may be connected to output device 210. Output device 210 may be another circuit in the Reed-Solomon ECC that verifies the output obtained from one of the memory circuits. If the data at the location indicated by the address 204 has been replaced by corrected data 203 then output data on the output data line 209 is same as corrected data 203. Otherwise, the output data on output data line 209 is the original data stored at the location indicated by address 204.

Typically, data circuit 202 is implemented as a logic based table as previously discussed. However, logic tables have significant disadvantages. For example, the size of the logic table required for a typical Ethernet FEC is large because of the large number of memory circuits (the number of memory circuits can vary from 33 to 128 and may be higher). Furthermore, a single logic table may have significant routing restrictions while broadcasting to a large number of memory circuits. This may require multiple copies of the memory refresh circuit of FIG. 2, which results in a large amount of logic. In an embodiment, an algorithmic data generation circuit as described below with respect to FIG. 3 may replace address circuit 201 and data circuit 202 to generate address 204 and corrected data 203.

Figure 3:
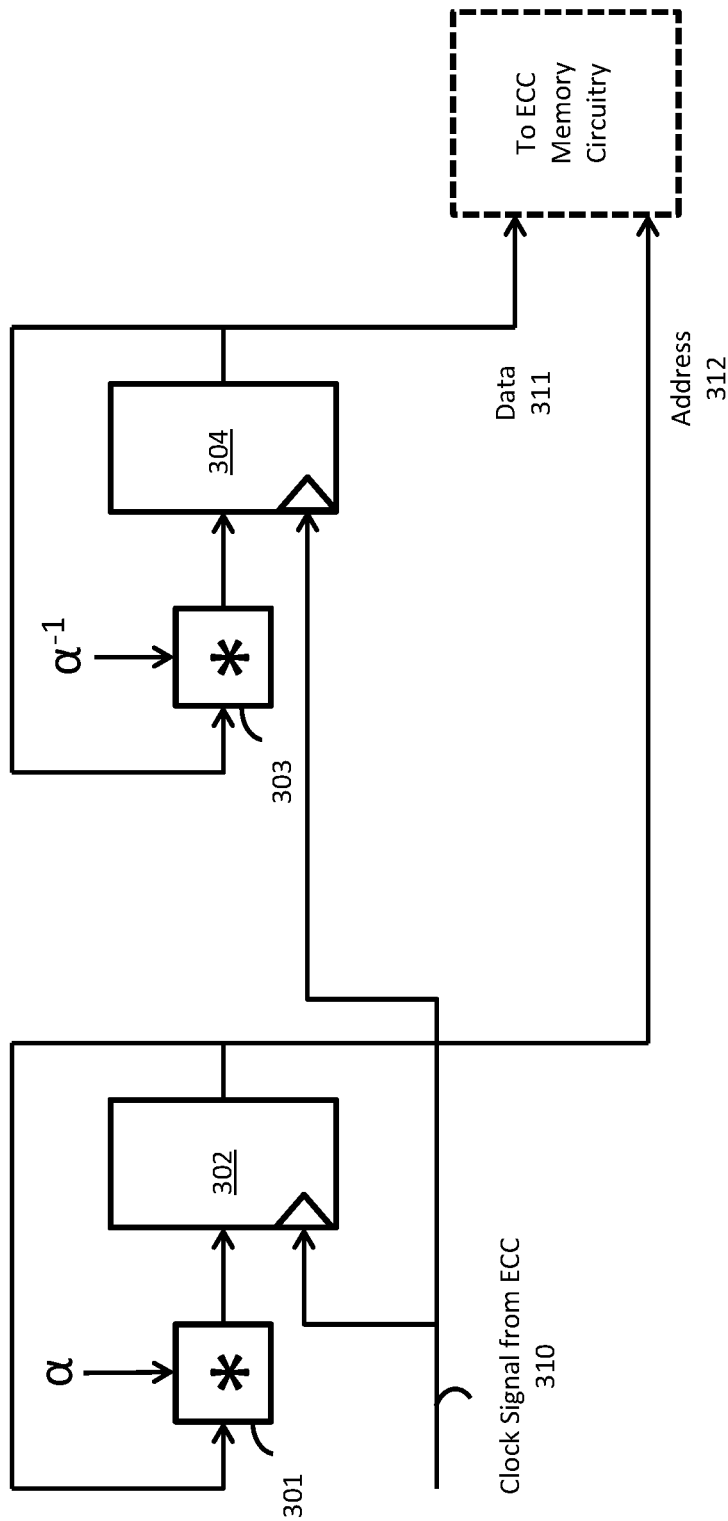
FIG. 3 illustrates exemplary algorithmic data generation circuitry in accordance with an embodiment of the present invention.

FIG. 3 illustrates exemplary algorithmic data generation circuitry in accordance with an embodiment of the present invention. For illustrating clear examples, FIG. 3 is discussed in relation to the memory refreshing circuit of FIG. 2. Referring again to FIG. 3, the algorithmic data generation circuit of FIG. 3 comprises two Galois field multipliers 301 and 303 coupled to two registers 302 and 304 respectively. In an embodiment, registers 302 and 304 receive clock signal 310 from an error correction circuit for example a Reed-Solomon ECC. The two registers store data generated by operation of the two multipliers. This data is used to identify memory locations with possible errors and correct said errors using error correction circuits. One advantage of the algorithmic data generation circuit of FIG. 3 is its small size as compared to the size of address circuit 201 and data circuit 202 of FIG. 2. In certain embodiments, the small size of the algorithmic data generation circuit of FIG. 3 may allow one algorithmic data generation circuit to be used per memory circuit.

In an embodiment, the algorithmic data generation circuit of FIG. 3 is used to refresh the inverse field values stored in memory circuits similar to memory circuits 205, 206, and 207 from FIG. 2. In an embodiment, the memory circuits may be a part of an error correction circuit (ECC). In an embodiment, the error correction circuit is a Reed-Solomon ECC circuit. In another embodiment, the error correction circuit may be based on Hamming codes. As described above, Reed-Solomon error correction techniques utilize Galois field values or their inverses (or multiples of such values) stored in memory circuits 205, 206, and 207. The addresses of locations in memory circuits 205, 206, and 207 where these Galois field values (or there inverses) are stored may themselves be identified using Galois field values (or their inverses). Therefore, the values can be refreshed with corrected data using the algorithmic generation circuit of FIG. 3 that generates a series of Galois field values and their corresponding inverses.

In an embodiment, register 302 contains a finite field value $\alpha^i$, which is multiplied by the primitive root $\alpha$ of the finite field at every clock cycle of clock signal 310 by GF multiplier 301. In an embodiment, i is equal to the number of system clock cycles. In an embodiment, the product of this multiplication is stored in register 302. In an embodiment, the product stored in register 302 may represent address 312. In an embodiment, address 312 may be an address belonging to the address space of memory circuits 205, 206, 207 of the Reed-Solomon ECC. Clock signal 310 is provided to clock inputs of registers 302 and 304. In an embodiment, clock signal 310 determines the value of i. In an embodiment, clock signal 310 has a lower clock rate than the system clock rate of integrated circuit 100. In an embodiment, the structures of GF multipliers 301 and 303 include a number of bitwise AND gates. In an embodiment, the structures of the GF multipliers include a number of XOR gates.

Similarly, register 304 contains $\alpha^{-i}$, the inverse of the value contained in register 302, and is multiplied by $\alpha^{-1}$, the inverse of the primitive root of the finite field, at every clock cycle of clock signal 310 by GF multiplier 303. The product of this multiplication is stored in register 304. In an embodiment, the product stored at register 304 may represent data 311 stored at a location indicated by address 312. In an embodiment where the algorithmic data generation circuit is a part of a Reed-Solomon ECC, data 311 may represent a Galois field value stored at memory location 312. In an embodiment, register 302 can be initialized to any value, as long as register 304 is initialized to the inverse of that value. This circuit works because of the following relationship:

$$(\alpha^i * \alpha) * (\alpha^{-i} * \alpha^{-1}) = \alpha^{i+1} * \alpha^{-(i+1)} = 1 \qquad (20)$$

Thus, no matter what the initialization values are, register 304 will contain the GF inverse of register 302. Register 302 outputs an address 312, and register 304 outputs corrected data 311. However, persons skilled in the art will appreciate that although register 302 is shown to contain address 312, and register 304 is shown to contain corrected data 311 (for the memory access), the reverse may also be true in certain embodiments.

Once initialized, the address will cycle through all the values of the field with one value per clock cycle of clock signal 310. Persons skilled in the art will note that due to the nature of GF values and their inverses, the addresses will be in order of the root powers of the field values and not sequential indexes. For example, for the 10 bit finite field (GF ($2^9$)) defined for 100GE, the address values may be 1,2,4,8,16,32,64, . . . 129,258,516,1,2 . . . while the data are 1,516,258,129—8,4,2,1 . . . and so on.

Figure 4:
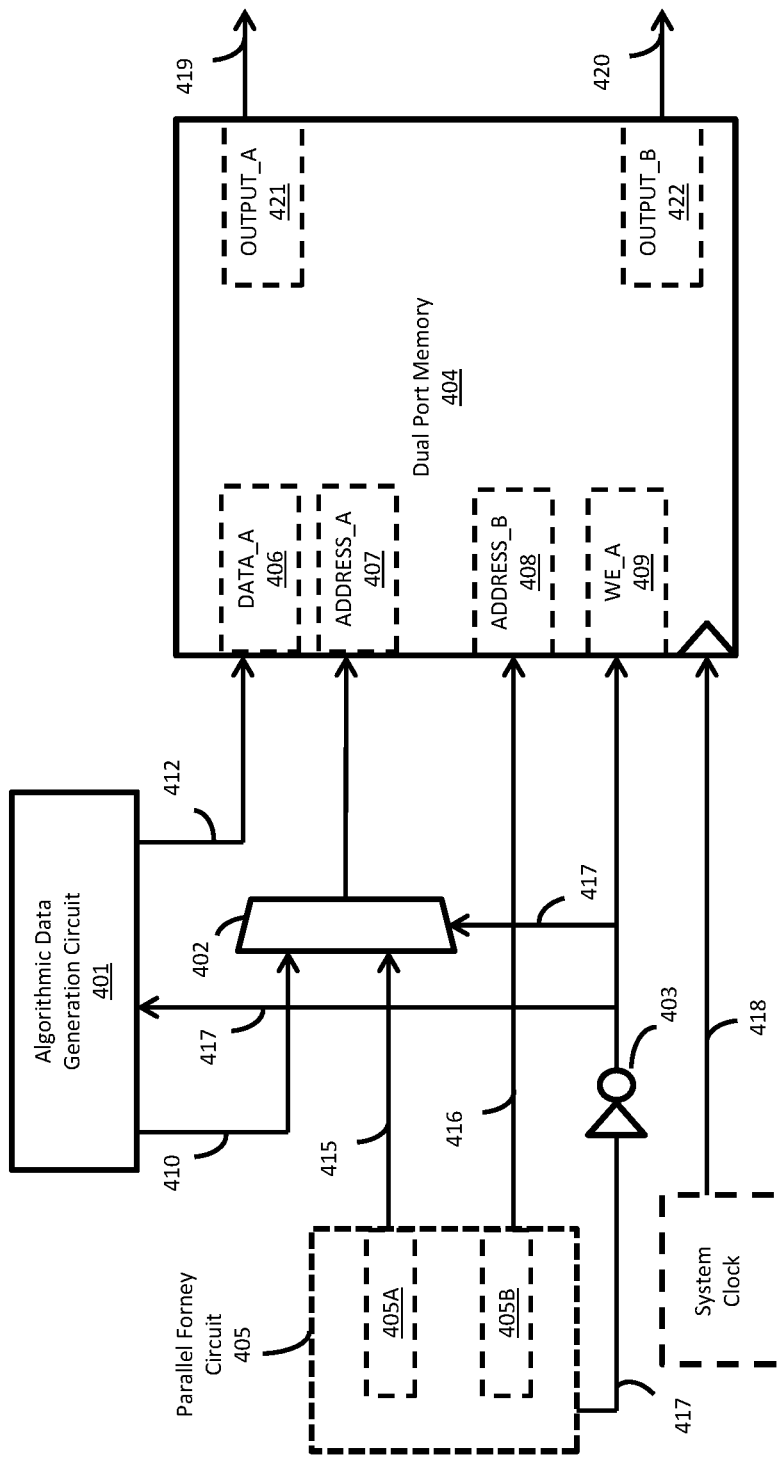
FIG. 4 illustrates exemplary circuitry for refreshing a true dual port memory in a Reed-Solomon code based forward error correction circuit in accordance with an embodiment of the present invention.

FIG. 4 illustrates exemplary circuitry for refreshing a true dual port memory in a Reed-Solomon code based error correction circuit in accordance with an embodiment of the present invention. For illustrating clear examples, FIG. 4 will be discussed in relation to algorithmic data generation circuit of FIG. 3.

As described in the above sections, the final step in the Reed-Solomon error correction process is determining error values for error locations determined through Chien search. Error values are obtained by implementing the Forney algorithm. Persons skilled in the art will appreciate that the Forney algorithm can be implemented using a serial Forney architecture or a parallel Forney architecture employing multiple Forney circuits.

In an embodiment, a parallel Forney architecture may be implemented using a true dual-port memory. The true dual-port nature of the memory can be exploited to provide inverses for the parallel Forney architecture. Persons skilled in the art will appreciate that this may halve the number of memory circuits required for storing inverse field values for Reed-Solomon ECC. This is because a single-port memory only allows one memory access at a time. On the other hand, a dual-port memory allows multiple reads or writes to occur at the same time.

Persons skilled in the art will appreciate that a true dual port RAM may include a data input for A, data input for B, address for A, address for B, write enable for A, write enable for B, data output for A, and data output for B such that A and B are the two ports of the true dual-port memory. In an embodiment, the true dual-port memory may operate such that when write enable for A is asserted, data input for A is written at address for A. Similarly, when write enable B is de-asserted, data is read from address for A and provided at data output for A. The data input, the address, and the data output for B operate in a similar manner. For dual-ported RAMS, A and B inputs can read or write to any address in the dual port memory.

FIG. 4 shows a solution to refresh dual-port memory circuit 404 using algorithmic data generation circuit 401. Algorithmic data generation circuit 401 is communicatively coupled to dual-port memory 404. Algorithmic data generation circuit 401 is also communicatively coupled to parallel Forney circuit 405 via multiplexer 402. In an embodiment, algorithmic data generation circuit 401 generates addresses and data in the form of finite field values (or their inverse) as described in FIG. 3. These data values and addresses are used to refresh the finite field values stored in true dual-port memory 404. In an embodiment, true dual-port memory 404 may include a data input for A (DATA_A) 406, address for A (ADDRESS_A) 407, address for B (ADDRESS_B) 408, and write enable for A (WE_A) 409. The data from A is output at data output A (OUTPUT_A) 421 and data from B is output at data output B (OUTPUT_B) 422. In an embodiment, the operations of the ECC (including dual-port memory 404) may be synchronized by clock signal 418. In an embodiment, clock signal 418 may be the system clock signal. In another embodiment, clock signal 418 may be generated by the ECC and may be slower than the system clock as described above.

Referring again to FIG. 4, algorithmic data generation circuit 401 is used to reload dual-port memory 404 when ADDRESS_A 407 is not being used to access inverse field values stored in dual-port memory 404. Since usage percentage (out of total up-time) of dual-port memory 404 in an ECC is low, algorithmic data generation circuit 401 may be used to refresh dual-port memory 404. For example, in 100GE circuits, the percentage of time used up for read operations may be less than 2% of the total usage time in 100GE. In an embodiment, parallel Forney circuit 405 detects an error and generates error signal 417. In an embodiment, error signal 417 may be generated in response to obtaining roots of error-location polynomials using a Chien search algorithm as described above. In an embodiment, the content of dual-port memory 404 is read only when error signal 417 is asserted.

Algorithmic data generation circuit 401 is provided to generate addresses and corrected data in the form of Galois field values and their inverses as described above in FIG. 3. Reed-Solomon ECC circuit error values are generated by parallel Forney circuit 405 based on the Galois field values stored in dual-port memory 404. In an embodiment, parallel Forney circuit 405 may include serial Forney circuits 405A and 405B (also called Forney circuit 405A and Forney circuit 405B) operating in parallel. In an embodiment, upon detection of an error, Forney circuits 405A and 405B use address signals 415 and 416 respectively, to access the inverses of GF values at ADDRESS_A 407 or ADDRESS_B 408 respectively. The inverse of field values stored at ADDRESS_A 407 or ADDRESS_B 408 are output using output signals 419 and 420 respectively from dual-port memory 404. In an embodiment, error signal 417 may be generated by Forney circuit 405A. Persons skilled in the art will appreciate that Forney circuit 405B may modify error signal 417 based on the parallel operation of Forney circuit 405B. In an embodiment, after error signal 417 is asserted by Forney circuit 405A, inverter 403 disables WE_A 409 to dual-ported memory 404. With WE_A 409 disabled, no data may be written to dual-port memory 404. Thus, if error signal 417 is asserted, then inverter 403 disables algorithmic data generation circuit 401 from updating dual-port memory 404. Furthermore, error signal 417 being asserted also ensures that address signal 415 is multiplexed into ADDRESS_A 408 of dual-ported memory 404 by multiplexer 402. In an embodiment, upon receiving address signal 415 at ADDRESS_A 408, dual-port memory 404 allows Forney circuit 405 to access the inverse field value at ADDRESS_A 408 and generates an output signal 419 via OUTPUT_A 421. The finite field values from OUTPUT_A 421 may be further utilized by Forney circuit 405 or other components of ECC.

In an embodiment, algorithmic data generation circuit 401 updates dual-port memory 404 if error signal 417 is not asserted because Forney circuit 405 detects no error. In an embodiment, with no error detected, error signal 417 is not asserted and WE_A 409 is not disabled. Therefore, updated finite field values that may be generated by algorithmic data generation circuit 401 may be used to update the incorrect finite field values stored in dual-port memory 404. In an embodiment, after error signal 417 is not asserted, inverter 403 flips and feeds error signal 417 to algorithmic data generation circuit 401, and algorithmic data generation circuit 401 continues to update dual-port memory 404.

Furthermore, in response to error signal 417 being fed into algorithmic data generation circuit 401 by inverter 403, multiplexer 402 selects no error address signal 410 for dual-port memory 404, and corrected data 412 (i.e. corrected finite field values generated by algorithmic data generation circuit 401) is written to the dual-port memory 404 due to enabling of WE_A 409.

In an embodiment, algorithmic data generation circuit 401 is allowed to update dual-port memory 404 with corrected data 412 regardless of whether an error is found. In such a scenario, if an error is found (i.e. error signal 417 is asserted), ADDRESS_A 407 is used to read address signal 415, and the data at no error address 410 will not be multiplexed to dual-ported memory 404. This embodiment allows algorithmic data generation circuit 401 to be used with several true-dual port memories simultaneously.

Figure 5:
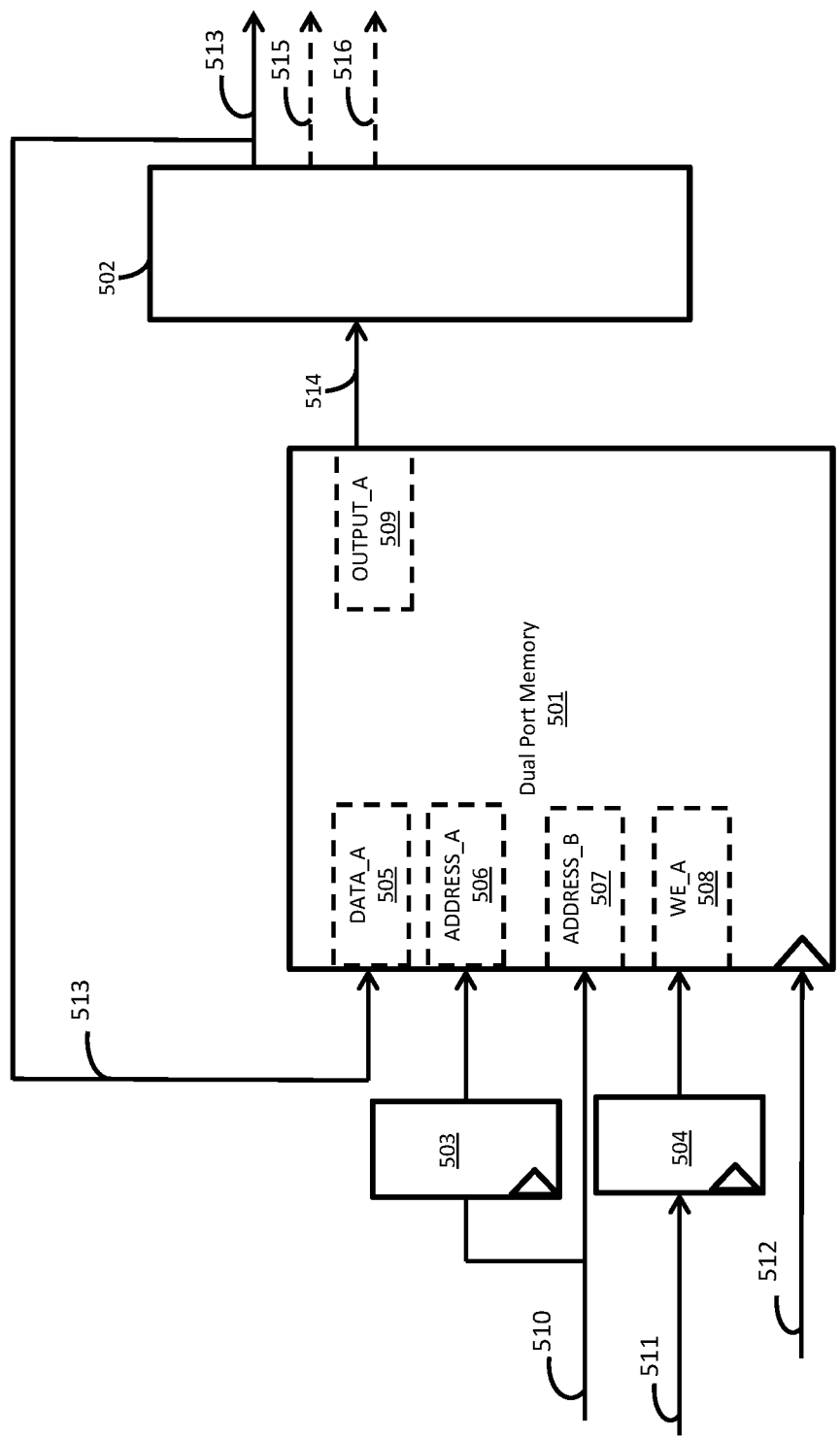
FIG. 5 illustrates exemplary circuitry for refreshing a true dual port memory in a Hamming codes based error correction circuit in accordance with an embodiment of the present invention.

FIG. 5 illustrates exemplary circuitry for refreshing a true dual port memory in a Hamming codes based error correction circuit in accordance with an embodiment of the present invention. For illustrating clear examples, FIG. 5 will be discussed in relation to algorithmic data generation circuit of FIG. 3.

Hamming codes are a class of binary linear codes. For each integer $r \geq 2$, there is a code with block length $n=2r-1$ and message length $k=2r-r-1$. Hence the rate of Hamming codes is $R=k/n=1-r/(2r-1)$, which is the highest possible for codes with minimum distance of three (i.e., the minimal number of bit changes needed to go from any code word to any other code word is three) and block length $2r-1$. The parity-check matrix of a Hamming code is constructed by listing all columns of length r that are non-zero, which means that the dual code of the Hamming code is the punctured Hadamard code. The parity-check matrix has the property that any two columns are pairwise linearly independent.

Due to the limited redundancy that Hamming codes add to the data, they can only detect and correct errors when the error rate is low. This is the case in computer memory (ECC memory), where bit errors are extremely rare and Hamming codes are widely used. In this context, an extended Hamming code having one extra parity bit is often used. Extended Hamming codes achieve a Hamming distance of four, which allows the decoder to distinguish between when at most one one-bit error occurs and when any two-bit errors occur. In this sense, extended Hamming codes are single-error correcting and double-error detecting, abbreviated as SECDED.

Referring now to FIG. 5, Hamming codes based ECC circuit 502 is communicatively coupled to dual-port memory 501. In an embodiment, dual-port memory 501 is similar to dual-port memory 404 described above. Similar to dual-port memory 404 of FIG. 4, dual-port memory 501 may also include data input for A (DATA_A) 505, address for A (ADDRESS_A) 506, address forB(ADDRESS_B) 507, and write enable for A (WE_A) 508. In an embodiment, the operations of the ECC (including dual-port memory 501) may be synchronized by clock signal 512. Clock signal 512 may be similar to clock signal 418 described above. In an embodiment, clock signal 512 may be the system clock signal. In another embodiment, clock signal 512 may be generated by the ECC and may be slower than the system clock as described above. In an embodiment, each pulse on clock signal 512 represents the start of a new clock cycle.

In an embodiment, dual-port memory 501 may store finite field values (or their inverses) for use by an ECC circuit. In an embodiment, the finite field values stored in dual-port memory 501 are output through output port (OUTPUT_A) 509 on output signal 514. In an embodiment, Hamming codes based ECC circuit 502 corrects the output data from OUTPUT_A 509. The corrected output data from OUTPUT_A 509 on output signal 514 is written back to DATA_A 505 of dual-port memory 501 via write-back signal 513. As discussed above, the Hamming ECC circuit can correct 1-bit errors, or 2-bit errors (optionally indicated on 1-bit signal line 515 and 2-bit signal line 516, respectively). In an embodiment, an error occurred signal is asserted on error occurred signal line 511 and is used as a write enable for dual-port memory 501. Error occurred signal 511 is delayed by error delay circuit 504, as the latency through the memory interface and possibly Hamming codes based ECC circuit 502 may be several clock cycles in length. Read address 510, being driven to ADDRESS_B 507, is also the write address being driven to ADDRESS_A 506 and is similarly delayed by address delay circuit 503. Persons skilled in the art would appreciate that in the circuit in FIG. 5, WE_A should always be asserted to have a much higher rate of refreshing of dual-port memory 501. Otherwise, the refreshing rate becomes error dependent and may lead to unexpected results.

Persons skilled in the art will appreciate that while the present disclosure only discusses the algorithmic data generation circuit of FIG. 5 with respect to error correction and data refresh in memory circuits, the same or substantially similar circuit may be used in any application that requires generating or refreshing Galois field values or relies on Galois field arithmetic. For example, Galois Field values are extensively used in cryptography. Because each byte of data is represented as a vector in a finite field, encryption and decryption using mathematical arithmetic is very straightforward and is easily manipulated.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. Any definitions expressly set forth herein for terms contained in such claims shall govern the meaning of such terms as used in the claims.

What is claimed is:

1. A memory refreshing circuit comprising:
a memory circuit that stores original data; and
an algorithmic data generation circuit that generates write addresses and correct data, wherein the correct data is stored in the memory circuit at locations that are indicated by the write addresses to correct errors in the original data by overwriting the original data with the correct data during a random access mode of operation of the memory circuit, wherein the algorithmic data generation circuit further comprises:
a first register that stores a first finite field value;
a first Galois Field (GF) multiplier coupled to the first register, wherein the first GF multiplier multiplies a first value with the first finite field value to generate a first output;
a second register that stores a second finite field value, wherein the second finite field value is mathematically inverse of the first finite field value; and
a second GF multiplier coupled to the second register, wherein the second GF multiplier multiplies a second value with the second finite field value to generate a second output, wherein the second value is mathematically inverse of the first value, wherein the first output is a write address, and wherein the second output is a value of correct data to be stored at the write address.

2. The memory refreshing circuit as defined in claim 1, wherein one value of the correct data is read from the memory circuit at a location indicated by a read address during a read only memory mode of operation of the memory circuit.

3. The memory refreshing circuit as defined in claim 2, wherein the memory refreshing circuit is implemented in a Hamming codes based error correction circuit (ECC).

4. The memory refreshing circuit as defined in claim 3, wherein the Hamming codes based ECC generates the write addresses and the correct data according to an error correction function.

5. The memory refreshing circuit as defined in claim 1, wherein the first value is a primitive root of the first finite field value.

6. The memory refreshing circuit as defined in claim 1, wherein the second value is a mathematical inverse of a primitive root of the first finite field value.

7. The memory refreshing circuit as defined in claim 1, wherein the first and second GF multipliers comprise at least one bitwise AND gate and at least one bitwise XOR gate.

8. The memory refreshing circuit as defined in claim 1, wherein the memory refreshing circuit is implemented in a Reed-Solomon forward error correction circuit.

9. The memory refreshing circuit as defined in claim 1, wherein the memory refreshing circuit is in an application specific integrated circuit, an application-specific standard product, a field-programmable gate array, a complex programmable logic device, or a system-on-chip.

10. A memory refreshing circuit comprising:
a memory circuit that stores original data; and
an algorithmic data generation circuit that generates write addresses and correct data, wherein the correct data is stored in the memory circuit at locations that are indicated by the write addresses to correct errors in the original data by overwriting the original data with the correct data during a random access mode of operation of the memory circuit,
wherein one value of the correct data is read from the memory circuit at a location indicated by a read address during a read-only memory mode of operation of the memory circuit,
wherein the memory refreshing circuit is implemented in an error correction circuit (ECC), wherein the ECC generates the write addresses and the correct data according to an error correction function, and
wherein the write addresses and the correct data are generated based on a delay equivalent to a sum of latencies of the read-only memory mode of operation and the error correction function, and wherein the delay equivalent is utilized by the memory refreshing circuit to overwrite the original data with the correct data.

11. A method of refreshing a memory circuit that stores original data comprising:
generating write addresses and correct data according to an error correction function using an algorithmic data generation circuit in an error correction circuit, wherein the correct data is stored in the memory circuit at locations that are indicated by the write addresses to correct errors in the original data by overwriting the original data with the correct data during a random access mode of operation of the memory circuit; and
reading one value of the correct data from the memory circuit at a location indicated by a read address during a read only memory mode of operation of the memory circuit,
wherein the write addresses and the correct data are generated based on a delay equivalent to a sum of latencies of the read only memory mode of operation and the error correction function, and wherein the delay equivalent is utilized by the algorithmic data generation circuit to overwrite the original data with the correct data.

12. The method of refreshing the memory circuit as defined in claim 11, wherein generating write addresses comprises:
receiving a clock signal at a first register that generates and stores a first finite field value based on the clock signal; and
multiplying the first finite field value with a first value using a first GF multiplier.

13. The method of refreshing the memory circuit as defined in claim 12, wherein generating write addresses further comprises:
receiving the clock signal at a second register that generates and stores a second finite field value based on the clock signal, wherein the second finite field value is mathematically inverse of the first finite field value; and
multiplying the second finite field value with a second value using a second GF multiplier, wherein the second value is mathematically inverse of the first value.

14. The method of refreshing the memory circuit as defined in claim 11, wherein each write address belongs to a set of addresses that spans an address space of the memory circuit.

15. An algorithmic data generation circuit comprising:
a first register that stores a first finite field value;
a first Galois Field (GF) multiplier coupled to the first register, wherein the first GF multiplier multiplies a first value with the first finite field value to generate a first output;
a second register that stores a second finite field value, wherein the second finite field value is inverse of the first finite field value; and
a second GF multiplier coupled to the second register, wherein the second GF multiplier multiplies a second value with the second finite field value to generate a second output, wherein the second value is mathematically inverse of the first value, wherein the second output is a write address and the first output is a value of correct data to be stored at the write address,
wherein the algorithmic data generation circuit generates write addresses and the correct data, wherein the correct data is stored in a memory circuit at locations that are indicated by the write addresses to correct errors in original data by overwriting the original data with the correct data during a random access mode of operation of the memory circuit.

16. The algorithmic data generation circuit of claim 15, wherein the first and second GF multipliers comprise at least one bitwise AND gate and at least one bitwise XOR gate.

17. The algorithmic data generation circuit of claim 15, wherein the first value is a primitive root of the first finite field value.

18. The algorithmic data generation circuit of claim 15, wherein the second value is a mathematical inverse of a primitive root of the first finite field value.

19. The algorithmic data generation circuit of claim 15, wherein the algorithmic data generation circuit is a part of a Reed-Solomon error correction circuit.

* * * * *